United States Patent

Brock et al.

[11] Patent Number: 5,181,770
[45] Date of Patent: Jan. 26, 1993

[54] SURFACE TOPOGRAPHY OPTIMIZATION THROUGH CONTROL OF CHLORIDE CONCENTRATION IN ELECTROFORMED COPPER FOIL

[75] Inventors: Andrew J. Brock, Cheshire; Lifun Lin, Hamden; Paul Menkin, Branford; Ned W. Polan, Madison, all of Conn.

[73] Assignee: Olin Corporation, New Haven, Conn.

[21] Appl. No.: 537,215

[22] Filed: Jun. 11, 1990

Related U.S. Application Data

[63] Continuation of Ser. No. 340,317, Apr. 19, 1989, abandoned.

[51] Int. Cl.$^5$ ............................................. C25D 1/04
[52] U.S. Cl. .................................................. 205/77
[58] Field of Search ........................................ 204/13

[56] References Cited

U.S. PATENT DOCUMENTS

| | | | |
|---|---|---|---|
| 964,096 | 7/1910 | Edison | 204/52.1 |
| 1,417,464 | 5/1922 | Edison | 204/13 |
| 1,543,861 | 5/1924 | McCord | 204/13 |
| 2,044,415 | 7/1932 | Yates | 204/13 |
| 2,602,774 | 5/1948 | Beaver | 204/52.1 |
| 2,762,762 | 9/1956 | Donahue | 204/11 |
| 3,287,236 | 11/1966 | Bernhauser et al. | 204/52.1 |
| 3,461,046 | 8/1969 | Clancy | 204/13 |
| 4,468,293 | 8/1984 | Polan et al. | 204/27 |
| 4,529,486 | 7/1985 | Polan | 204/13 |
| 4,569,950 | 10/1985 | Polan et al. | 204/206 |
| 4,647,345 | 3/1987 | Polan | 204/13 |
| 4,789,438 | 12/1988 | Polan | 204/13 |

FOREIGN PATENT DOCUMENTS 310989 12/1988 Japan.
310990 12/1988 Japan.

Primary Examiner—T. M. Tufariello
Attorney, Agent, or Firm—Gregory S. Rosenblatt; Paul Weinstein

[57] ABSTRACT

An electrolyte solution for the electroforming of metal foil, such as copper, is provided. The electrolyte contains an effective concentration of chloride ions to promote the formation of a uniformly matte surface finish. Foil so formed forms a strong mechanical bond with a dielectric substrate during a subsequent lamination process.

9 Claims, 3 Drawing Sheets

CL⁻ DOSING
EXPERIMENT

| CL (PPM) | UNIAXIAL TENSILE % ELONG. |
|---|---|

0    7

0.5    16

2    16

6    15

CL⁻ DOSING EXPERIMENT

| CL (PPM) | UNIAXIAL TENSILE % ELONG. |
|---|---|
| 18 | 17 |

| 45 | 11 |
|---|---|

| 100 | 7 |
|---|---|

SURFACE TOPOGRAPHY OPTIMIZATION THROUGH CONTROL OF CHLORIDE CONCENTRATION IN ELECTROFORMED COPPER FOIL

This application is a continuation of application Ser. No. 07/340,317, filed Apr. 19, 1989, now abandoned.

This invention relates to the invention disclosed in U.S. patent application Ser. No. 199,406 entitled APPARATUS AND PROCESS FOR THE PRODUCTION OF MICRO-PORE FREE HIGH DUCTILITY METAL FOIL, filed May 26, 1988 (now abandoned) and assigned to a common assignee.

The present invention relates to electroformed metal foil and an acid copper electroplating solution for electrolytically producing foil. The copper foil so produced is characterized by a uniform matte surface and exhibits high ductility.

The production of electroformed or electrodeposited metal foil, especially copper foil, is of considerable importance because of its use in the production of printed circuits for electronic and electrical equipment. As demonstrated by U.S. Pat. Nos. 1,417,464 to Edison and 1,543,861 to McCord, the basic electroforming technology is old and well known in the art. Generally, the metal foil is formed by partially immersing and rotating a cylindrical cathode drum in an appropriate electrolyte and applying an electrical current between the cathode and an anode which is also at least partially immersed in the electrolyte. When the plated surface of the cylindrical cathode emerges from the electrolyte, the metal foil formed thereon is stripped from the surface and coiled on a roll.

To promote the formation of metal foil having uniform thickness, at least one stationary anode is mounted in the electrolytic cell concentric with the rotating drum cathode. In most electroforming systems used today, a split anode having a central passageway or manifold between the anode sections is employed. The passageway or manifold feeds electrolyte across the bottom of the rotating drum cathode and into the gap between the cathode and anode sections. This arrangement is intended to provide fresh electrolyte across the plating surface of the cathode. U.S. Pat. Nos. 2,044,415 to Yates, 3,461,046 to Clancy and 4,529,486 to Polan exemplify such systems.

A significant portion of the electroformed foil is used in the manufacture of printed circuit boards. To manufacture a printed circuit board, typically, one or more foil layers are bonded to a dielectric substrate such as a glass filled epoxy. Bonding is effected by lamination. The foil is physically pressed into the substrate through the appropriate application of heat and pressure.

The bond between the substrate and the foil is primarily mechanical in nature. Adhesion is achieved mostly through physical interlocking rather than through chemical interaction. By maximizing surface area and surface roughness, adhesion may be improved.

After lamination of the foil to the substrate, circuit traces are formed in the foil. These traces are typically formed by a photolithographic process followed by a chemical etch. To promote uniform etching of the foil to maintain straight line circuitry, the foil texture is preferably uniform.

To integrate these two concepts, namely the foil should contain surface roughness to promote physical adhesion and the roughness should be uniform to permit uniform etching and line formation, the foil preferably is characterized by a uniform matte surface.

Other required properties of the copper foil are high ductility and a minimum of pores or inclusions. One approach to increasing the ductility is to add stress relieving additives to the plating electrolyte such as thiourea compounds as disclosed in U.S. Pat. No. 3,287,236 to Brugger et al. Other common additives to copper plating baths include hide glue, gelatin and hydrochloric acid. A method of increasing ductility without the use of plating additives is ultrasonic agitation of the electrolyte as disclosed in U.S. Pat. No. 4,647,345 to Polan.

Essentially pore free foil has been obtained by random polishing of the cathode drum to produce a generally isotropic surface finish as disclosed in U.S. Pat. No. 4,789,438 to Polan.

Pores and pin holes in the foil have also been reduced through the use of a dual filtration system to continuously remove particulate matter and surface impurities from the electrolyte. Such a filtration system has been disclosed in U.S. Pat. No. 4,549,950 to Polan et al.

As disclosed in the above-cited U.S. patent application Ser. No. 199,406, a preferred electrolytic method of manufacture of the copper foil is to employ an ultra-pure acidic copper bath. Ultra-pure copper solutions, containing only copper metal and sulfuric acid have been found to produce foils free of micro-voids and grain boundary inclusions. Through the use of mechanical filtration and activated carbon filtration, the impurity levels are monitored and preferably maintained below the limits of detection which may approach the range of parts per billion.

While the foil produced by the process of Ser. No. 199,406 has superior properties as far as ductility and the absence of micro-pores or grain boundary inclusions, the surface texture of the foil is smooth. It is an object of the present invention to produce a copper foil having a uniform matte surface finish with all the advantages of the foil produced by the process of Ser. No. 199,406.

The process of the invention incorporates the addition of chloride into the electroplating solution. The addition of chloride to an acidic copper bath has been disclosed to minimize the formation of hydrogen bubbles leading to a less brittle foil having a smooth and uniform surface in U.S. Pat. No. 964,096 issued to Edison.

U.S. Pat. No. 2,602,774 (RE 24,253) issued to Beaver discloses the addition of from 1 to 1.5 parts per million of chloride to an acidic copper plating bath containing a brightening agent. The chloride was found to promote a bright copper deposit characterized by a smooth and uniform deposit.

The use of from 25 to 45 parts per million of chloride in an acid copper bath to form low stress electroformed structures which peal easily from the cathode has been disclosed in U.S. Pat. No. 2,762,762 issued to Donahue.

However, until now, it has not been recognized that the addition of chloride in specific concentration ranges to an ultra-pure acid copper plating bath produces a copper foil having superior mechanical properties. The foil has a matte finish and forms a strong mechanical bond to an epoxy glass substrate.

Therefore, in accordance with the invention, there is provided an acid copper electrolyte solution useful for the production of an electroformed copper foil. The foil so produced has a uniform matte finish. The foil further is characterized by high uniaxial tensile ductility. It is an advantage of the foil so produced that the foil forms a superior bond to a substrate and is of use in the manufacture of printed circuit boards. It is a further advantage of the foil that it is essentially micro-pore free and free of intergranular inclusions. It is a feature of the invention that the foil so produced has a uniform surface topography. The uniform surface topography is advantageous to the formation of uniform circuit traces.

In accordance with the present invention, an ultra-pure electrolyte is produced. The electrolyte comprises from about 50 grams per liter to about 150 grams per liter of copper, from about 10 grams per liter to about 100 grams per liter of sulfuric acid and an effective amount of chloride ions to obtain a uniform matte surface. The chloride concentration is maintained within either the range of from about 0.5 parts per million (ppm) to about 2.5 ppm or in the range of from about 10 ppm to about 50 ppm.

The above stated objects, features and advantages of the invention as well as others will become more apparent from the specification and drawings which follow.

Figure 1:
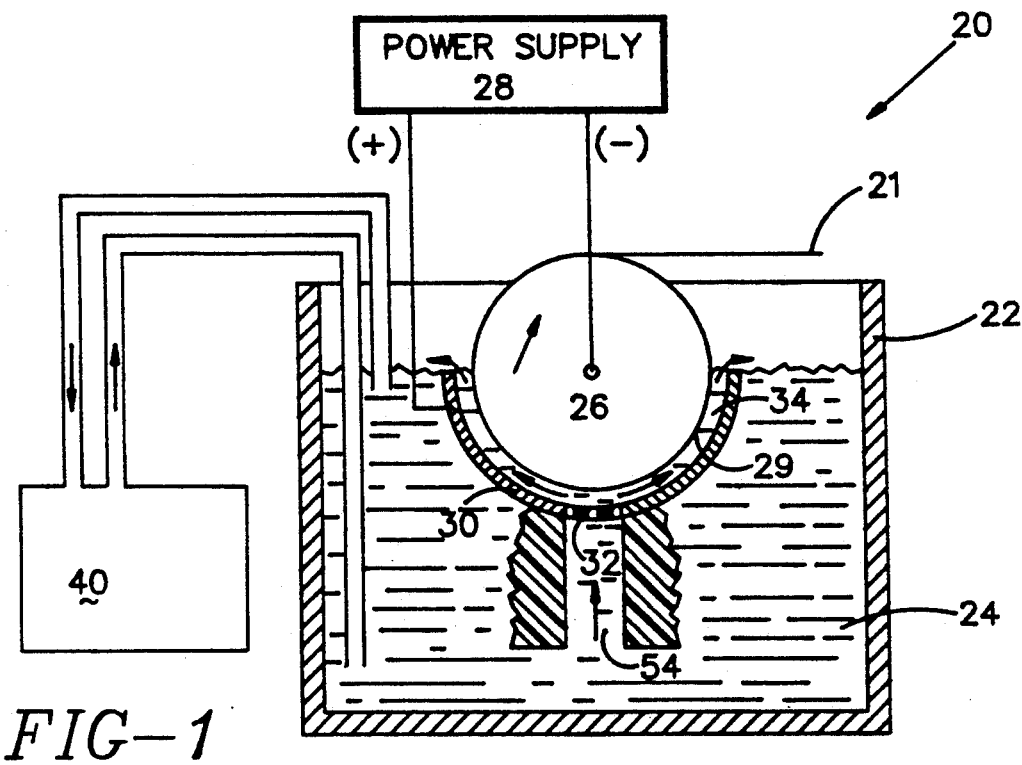
FIG. 1 illustrates an electrolytic cell capable of producing electrodeposited foil in accordance with the present invention.

FIG. 1 illustrates an apparatus for manufacturing metal foil having a uniform matte surface finish. An electrodeposition system 20 for producing metal foil 21 comprises a plating tank 22 designed to hold electrolyte 24. A rotatable metal drum 26 is connected to a power supply 28. The drum is connected to the negative terminal of the direct current power supply and serves as the cathode. The power supply may be designed to supply constant direct current or pulsed current as disclosed in U.S. Pat. No. 4,468,293 by Polan et al.

The drum is formed from any suitable electrically conductive metal or metal alloy including but not limited to lead, stainless steel, columbium, tantalum, titanium, chromium and alloys thereof. In a preferred embodiment, the drum cathode 26 comprises a stainless steel drum having a plating surface 29 formed from titanium or titanium alloys. The plating surface is preferably finished with an isotropic finish as disclosed in U.S. Pat. No. 4,789,438. The drum cathode may be rotated by any suitable motor drive system (not shown) in the art.

An anode 30 preferably has an arcuate shape and a central perforated zone 32. The anode 30 may be formed from any suitable preferably insoluble electrically conductive metal or metal alloy. Preferred anode materials include lead and alloys of lead and antimony or alloys of lead, antimony and silver. Other preferred anode materials include dimensionally stable materials such as platinum clad metals and sintered transition element oxides coating a base material such as titanium. If desired, the central perforated zone 32 may be formed from a different material than the rest of the anode 30. For example, the central perforated zone 32 may be made from a material more resistant to erosion than the material forming the rest of the anode 30. The anode 30 is described in more detail in U.S. Pat. No. 4,529,486, which is hereby incorporated by reference herein.

The anode 30 may be mounted in the tank 22 by any suitable means (not shown) known in the art. Generally, the anode 30 is mounted in a way which provides a substantially uniform interelectrode gap 34 with the moving plating surface 29 of the drum cathode 26. The interelectrode gap 34 is preferably kept small to limit voltage increases due to electrolyte resistance. Ideally, the interelectrode gap should be less than about 50 millimeters. Preferably, the gap 34 is in the range of from about 5 millimeters to about 40 millimeters and most preferably, the gap is from about 10 millimeters to about 30 millimeters.

The electrolyte 24 generally comprises an aqueous solution containing a concentration of metal ions to be deposited on the plating surface 29 of the rotating drum. For example, if copper foil is to be formed, the electrolyte 24 would contain a concentration of copper ions. Alloy plating is a known art and this invention is not limited to electrolytes containing a single species of metal ions. During plating, it is desirable to maintain the electrolyte 24 temperature in the range of from about room temperature to about 100° C. The tank 20 may be provided with any suitable heating and/or cooling device (not shown) known in the art.

As detailed hereinbelow, the purity of the electrolyte must be maintained. To this end, a filtration system 40 is utilized. The filtration system 40 is shown in detail in FIG. 2.

In accordance with the present invention, the electrolyte 24 is supplied in an essentially pure condition. No additives either organic or inorganic are added to the electrolyte. On the contrary, all additives and impurities are excluded.

Additives have been found to be deleterious because the additives will degrade in time through reaction with the electrolyte. Degradation also occurs through oxidation at the anode. The reaction products of some additives also appear to degrade foil quality and must be removed from the electrolyte. While conventional techniques are capable of removing a large percentage of the spent additives, no system has been found to remove all the reaction products. Trace amounts of spent additives, on the level of parts per million or even parts per billion, are sufficient to promote micro-void formation or the inclusion of additive species at grain boundaries and a deterioration of foil quality. Therefore, no additives are used in accordance with this invention.

It is desirable to use a pure electrolyte. For example, if copper foil is being produced, an exemplary electrolyte would comprise:

|  | Range | Preferred |
|---|---|---|
| Copper | 50 g/l–150 g/l | 70 g/l–140 g/l |
| Sulfuric acid | 10 g/l–100 g/l | 30 g/l–70 g/l |
| Chloride as Cl$^-$ | 0.5 ppm–2.5 ppm OR 10 ppm–50 ppm | 1.2 ppm–2.2 ppm |
| Temperature | 25° C.–100° C. | 40° C.–60° C. |
| Current density | .1 A/cm$^2$–3 A/cm$^2$ | .8 A/cm$^2$–1.5 A/cm$^2$ |

The copper is generally supplied as copper sulfate or clean, pure copper wire or cupric oxide dissolved in sulfuric acid.

Other exemplary electrolytes include nickel from a Watts type, chloride or fluoroborate electrolyte; copper from cyanide, fluoroborate or pyrophosphate electrolyte; iron from fluoroborate-sulfate solutions; silver from a cyanide solution; and conventional electrolytes used for plating zinc, tin, chromium, alloys thereof or other metals or metal alloys. It has been found especially important to maintain the electrolyte impurity and particulate free. To that end, a filtration and replenishment system as illustrated in FIG. 2 is supplied.

Figure 2:
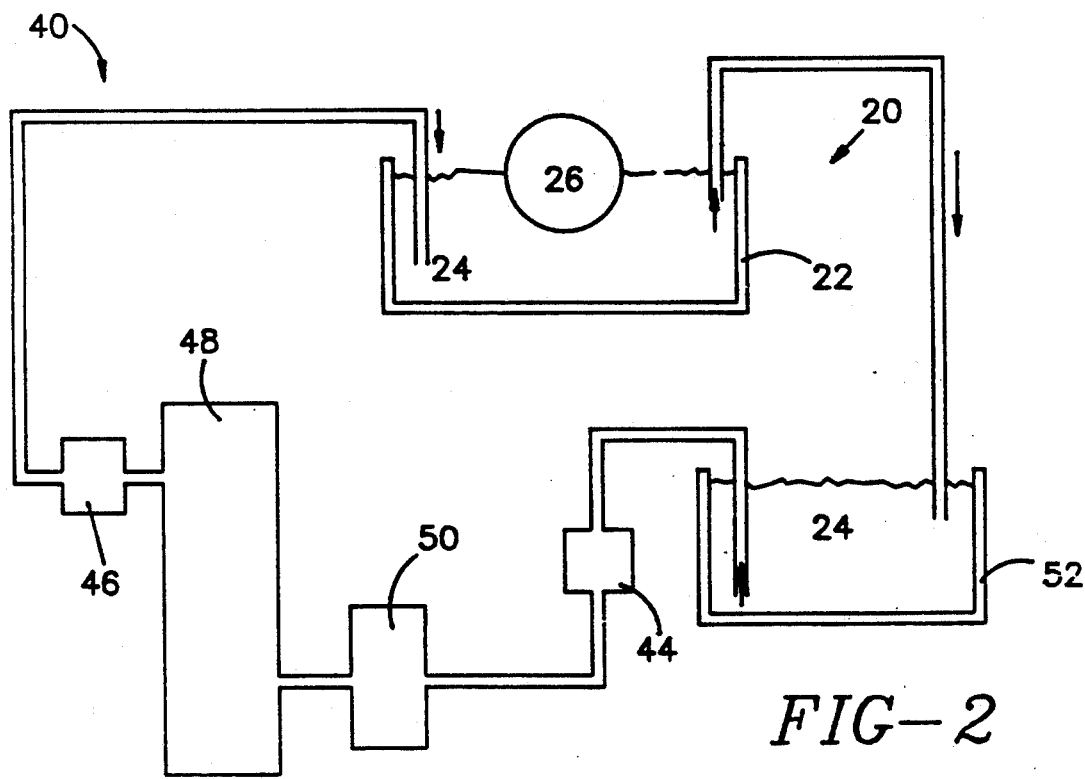
FIG. 2 illustrates by block diagrams the filtration and replenishment system of the present invention.
Figure 3:
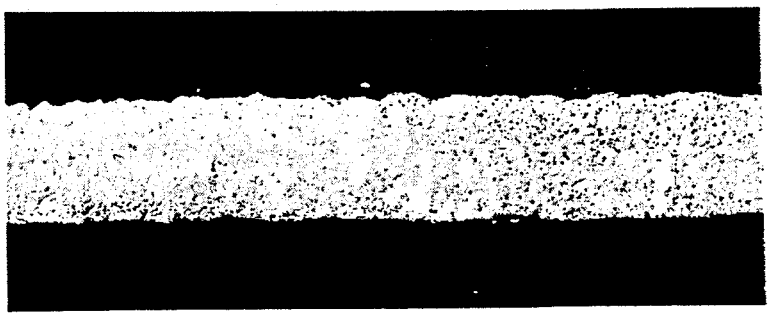
FIGS. 3-9 illustrate micrographs of copper foil deposited from electrolyte with varying chloride concentrations.
Figure 4:
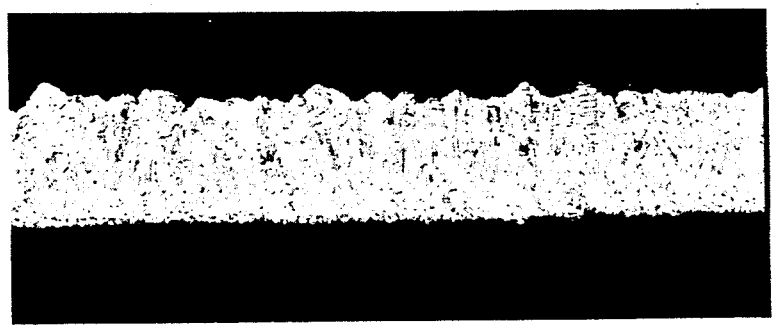
Figure 5:
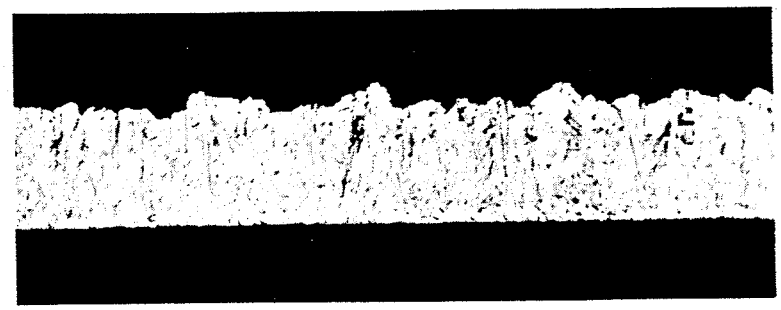
Figure 6:
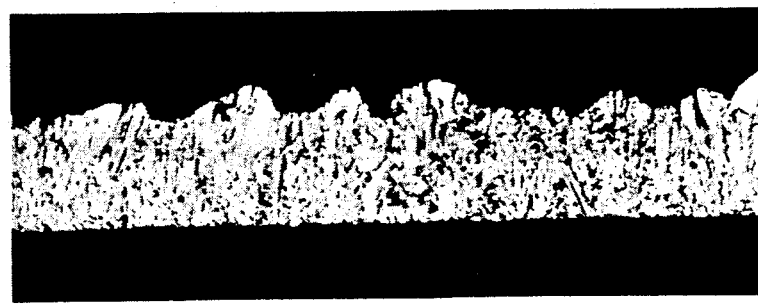
Figure 7:
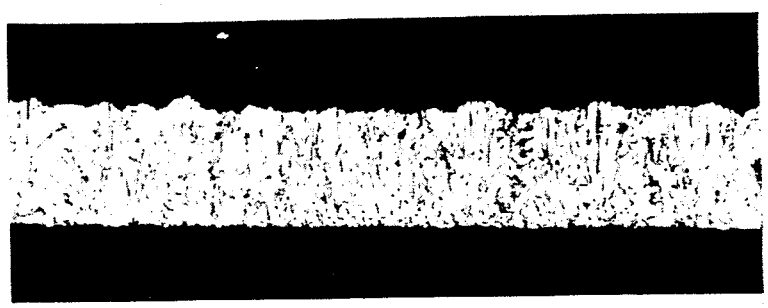
Figure 8:
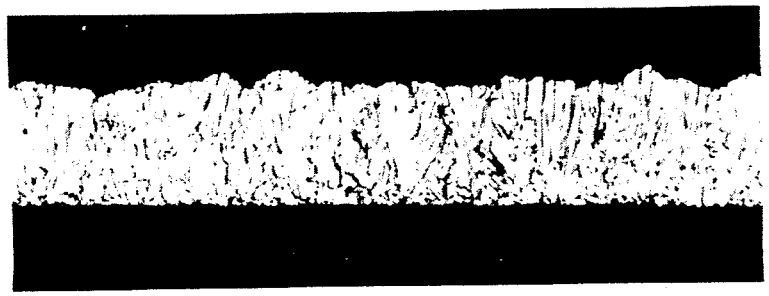
Figure 9:
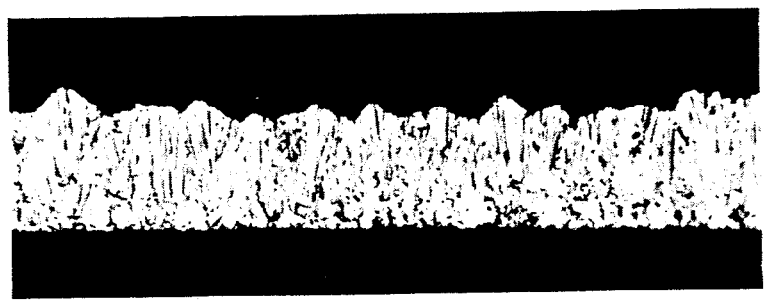

Referring now to FIG. 2, the electrolyte 24 is continuously filtered. Filtering removes solid particulate matter introduced by anode leaching and adventitious contamination.

The metal foil formation process constantly removes metal ions from the electrolyte. The plating bath 22 must be continuously replenished with fresh metal ion electrolyte. To maintain proper volume levels, depleted electrolyte is pumped from the plating tank 22 by means of pump 44. Depleted electrolyte and fresh electrolyte are combined in holding tank 52. The proper amount of metal ions are added to the holding tank to achieve a desired concentration. For example, in one exemplary process to produce copper foil, the depleted electrolyte is primarily sulfuric acid. The copper ion concentration is increased by adding copper as either copper metal or copper sulfate to holding tank 52.

The reconcentrated electrolyte, which may either be new material or replenished, flows from the holding tank 52 to a first particulate filter 50. Usually a conventional pumping system 44 is supplied to maintain the electrolyte flow through the filtration system 40. The pumping system 44 is selected to have sufficient capacity to maintain an adequate flow of electrolyte. The particulate filter removes solid particulate matter from the electrolyte which may have been introduced to the electrolyte with the starting materials, anode leaching or by adventitious contamination. The filter mesh must be sufficiently fine to entrap particulate matter, but not sufficiently fine to impact severely on the flow rate of the electrolyte. A filter mesh of from about 1 micron to about 100 microns and most preferably from about 1 micron to about 10 microns has been found acceptable.

The electrolyte is next passed through a carbon filter 48 to remove organic contamination. The carbon filter 48 is typically about 6 feet long but may be up to about 20 feet long. The electrolyte flows through the carbon filter at a rate of from about 0.5 gallon/min/ft$^2$ to about 2.0 gallon/min/ft$^2$. A preferred flow rate through the carbon filter is in the range of from about 0.8 gallon/min/ft$^2$ to about 1.2 gallon/min/ft$^2$. The filter 48 is packed with granular activated carbon to maximize the surface area and absorption capability of the carbon.

Absent pretreatment of the carbon, carbon filtration may introduce chloride or sulfide ions or other impurities into the electrolyte which are deleterious to the properties of the electrodeposited foil. Suitable pretreatment of the granular carbon within the filter 48 includes leaching the carbon by washing with a sulfuric acid solution followed by a deionized or distilled water rinse. A sulfuric acid concentration of about 2.5% by volume to about 20% by volume is preferred and a most preferred concentration is in the range of from about 5% by volume to about 10% by volume.

The selection of the carbon used within the carbon filtration system is important. Chloride concentration must be carefully regulated so carbons which are prewashed in hydrochloric acid are not recommended. Preferred carbons are manufactured from coconut shells and have a granule size of about 10 to about 60 mesh. Most preferred carbons are prewashed in nitric acid and have a granule size of about 12 mesh to about 30 mesh and an ash content not to exceed 5%. The most preferred carbon may be obtained from Barneby Cheney (Columbus Ohio) or California Carbon Company, Inc. (Wilmington, Calif.).

The electrolyte next passes through a second particulate filter 46 which removes any carbon granules which may have been swept up by the electrolyte. The second particulate filter 50 preferably has a final stage size of from about 0.5 microns to about 30 microns and preferably from about 1 micron to about 5 micron.

The purified electrolyte 24 is then pumped back into the plating tank 22. Impurities, especially organics and sulfides are kept in concentrations of less than about 5 parts per million and preferably less than about 1 part per million and most preferably at the limits of detection, in the range of parts per billion.

In accordance with the invention, the chloride concentration is maintained within one of two effective ranges. The effective concentration of chloride is that which when added to the electrolyte produces a metal foil having a uniform matte finish. For the acid copper electrolyte, two chloride ranges were identified. These ranges are from about 0.5 ppm to about 2.5 ppm and from about 10 ppm to about 50 ppm. Within each range are preferred ranges, namely, from about 1.2 ppm to about 2.2 ppm and from about 10 ppm to about 20 ppm. The most preferred chloride concentration is from about 1.2 ppm to about 2.2 ppm.

As detailed in TABLE 1, surprisingly two effective ranges of chloride are available and chloride concentrations between these two ranges are ineffective. Chloride concentrations of from about 4 ppm to about 8 ppm produce a coarse irregular foil which is not suitable for printed circuit board applications.

The inventors have discovered that maintaining the chloride concentration within the effective ranges leads to a foil having a uniform matte surface with a surface profile (depth between peak and valley) of about 6 microns. The foil is further characterized by good tensile ductility, having a uniaxial elongation of about 16% when measured over a two inch gauge length.

The data reproduced in TABLE 1 below was generated by evaluating actual foils produced in a pilot plant scale ED foil manufacturing site using the equipment illustrated in FIGS. 1 and 2. The uniaxial tensile elongation was measured using a Tineous-Olson horizontal tensile tester. A foil sample was elongated at the rate of 2 inches per minute with the sample at room temperature.

The profile which is a measurement of the average distance between the peaks and the valleys on the surface of the foil was measured by measurement of a micro-section magnified to 500x. Alternatively, a profilometer may be employed. FIGS. 3-9 illustrate the micrographs of copper foil deposited from electrolyte containing varying concentrations of chloride. The data is quantified in TABLE 1.

TABLE 1

| Cl$^-$ ppm | Tensile Elongation % | Profile microns | Comments |
|---|---|---|---|
| 0 | 7 | 2 | Too smooth |
| 0.5 | 16 | 4 | Uniform matte |
| 2 | 16 | 6 | Uniform matte |
| 6 | 15 | 10 | Irregular |
| 18 | 17 | 4 | Uniform matte |
| 45 | 11 | 6 | Uniform matte |
| 100 | 7 | 8 | Irregular, |

TABLE 1-continued

| Cl⁻ ppm | Tensile Elongation % | Profile microns | Comments |
|---|---|---|---|
| | | | Cl₂ generation |

From Table 1, the preference for chloride ranges of from about 0.5 ppm to about 2.5 ppm and from about 10 ppm to about 50 ppm may be seen. Within these ranges, the electroformed foil is characterized by a uniform matte surface and relatively high ductility. Within the most preferred range of from about 1.2 ppm to about 2.2 ppm, the surface has a uniform matte surface with a large peak to valley profile. The foil also has relatively high ductility.

The chloride concentration is monitored by the use of a silver/sulfide electrode. The potential of the electrode against a suitable reference electrode is measured in a sample of the electrolyte solution which has been diluted 1 to 1 with distilled water. A suitable silver/sulfide electrode is Model 94-16 manufactured by Orion Research Inc. (Boston, Mass.). The method is sensitive to 0.04 ppm chloride in the diluted electrolyte which corresponds to 0.08 ppm in the undiluted solution.

Additions of chloride are preferably made to each tank 22, 52 and filter 46, 48, 50 as illustrated in FIG. 2. By this manner, a uniform chloride concentration is maintained throughout the electroplating system. However, chloride additions may also be made to a single process tank or filter or to any combination of tanks and filters.

The chloride concentration is maintained by the batch addition of any suitable chloride containing reagent to the solution. A most preferred means to maintain the chloride concentration is by the addition of hydrochloric acid. Preferably, the hydrochloric acid is diluted with a known volume of deionized water to better monitor the concentration of chloride ions. To maintain the chloride concentration as uniform as possible, continuous additions of hydrochloric acid employing automated or computer controlled metering may be employed.

Tensile elongation is measured in accordance with the Institute For Interconnecting and Packaging Electronic Circuits (IPC) (Evanston, Ill.) procedures. The IPC has devised a series of classifications for electrodeposited foil. Class 3 is defined as high temperature elongation electrodeposited copper foil and is the form of foil used to form circuit traces in printed circuit boards. Class 3 copper foil is specified as having an elongation of at least 2% in both longitudinal and transverse directions. Elongation is measured both at an elevated temperature of 180° C. and at room temperature (23° C.).

High ductility is a desired property for this type of metal foil. The copper foil is bonded to a dielectric carrier which may be fiberglass-epoxy, polyimide or ceramic board. The foil is then formed into a desired circuit pattern. The circuitry may be formed in the foil by selective chemical etching or by laser scribing. The circuit traces are usually only a few thousandths of an inch wide. Thermal and mechanical stresses are imposed on the narrow foil traces during processing and service. High foil ductility is necessary to prevent breakage at elevated temperatures, that is, from temperatures of about room temperature to about 600° F.

Referring back to FIG. 1, the chloride containing electrolyte 24 is directed against the plating surface 29 of the rotating cathode drum 26 through manifold 54, for example, by a pump (not shown). The flow of electrolyte is controlled to maximize turbulence. The flow rate is at least 0.5 meters per second and preferably in the range of about 1.0 meter per second to about 4 meters per second. The combination of high flow rate and high current densities and increased plating rates. This combination provides for rapid removal of oxygen bubbles. The oxygen bubbles are generated at the anode 30 as a by-product of the electrochemical reactions occurring there.

The free chloride within the electrolyte acts as a hydrogen scavenger and bonds with any hydrogen gas formed during the electolytic process. Since both the oxygen and hydrogen gas by-products of the electroforming operation are kept away from the foil, gas occlusion is minimized. Minimizing gas occlusion within the foil is believed to increase the overall tensile strength of the electrodeposited foil.

The foil 21 may be formed to any desired thickness. For example, unsupported foils as produced using a rotating cathode drum typically have thicknesses from about 0.0005 inches to about 0.015 inches. Preferably, the foil thickness is from about 0.0005 inches to about 0.003 inches. The thickness is controlled by varying the current density and the rotational speed of the cathode drum. The process could also be used for supported foils, for example, those produced by plating on an aluminum carrier. Supported foils may be much thinner than the unsupported foils.

While the plating apparatus, product and process have been described in accordance with metal foil manufactured from a rotating cathode drum, it is recognized other plating systems to produce metal foil are also known, such as a continuous or non-continuous belt. The processes described above are readily applicable to other foil manufacturing techniques known in the art.

While the process has been particularly described in terms of copper foil production, other metal or metal alloys may also be electroformed according to the process of the invention and the invention is not limited to copper foils.

The patents and patent applications set forth in the specification are intended to be incorporated by reference herein.

It is apparent there has been provided in accordance with the invention a process for producing essentially pore free and inclusion free metal foil having a uniformly matte surface for improved adhesion to a dielectric substrate which satisfies the objects, features and advantages set forth hereinabove. While the invention has been set forth in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A process for forming an electroformed metal foil having a uniform matte surface texture, comprising the steps of:
    providing an electrodeposition system containing:
        (a) a tank containing an electrolyte solution;
        (b) providing an essentially contamination-free acidic electrolyte in which impurities such as organics and sulfides are less than about 5 parts per million and containing ions of copper and an effective concentration of chloride ions to produce said uniform matte surface texture, said electrolyte comprising from about 50 grams per liter to about 150 grams per liter copper, from about 10 grams per liter to about 100 grams per liter sulfuric acid and from about 0.5 ppm to about 2.5 ppm chloride;

(c) a cathode having a continuous plating surface at least partially immersed in said electrolyte solution, said immersed plating surface defining the extent of the plating zone; and (d) an anode;

applying a desired current density to said cathode and said anode for plating metal values from said electrolyte solution onto said plating surface to generate a substantially uniform current distribution throughout said plating zone for promoting formation of said substantially uniform metal foil thereby electrolytically generating said foil of copper from said electrolyte;

filtering said electrolyte so that it is essentially free of sulfides, organic materials and other contaminants and particulates; and providing a flow rate of said electrolyte past said cathode sufficient to prevent oxygen accumulation along said cathode.

2. The process of claim 1 wherein said cathode comprises a rotating drum.

3. The process of claim 1 wherein said cathode comprises a stainless steel drum having a titanium or titanium alloy plating surface.

4. The process of claim 1 wherein said chloride concentration is from about 1.2 ppm to about 2.2 ppm.

5. The process of claim 3 wherein said electrolyte comprises:

from about 70 grams per liter to about 110 grams per liter copper;

from about 30 grams per liter to about 70 grams per liter sulfuric acid; and from about 1.2 ppm to about 2.2 ppm chloride.

6. A process for forming an electroformed metal foil having a uniform matte surface texture, comprising the steps of:

providing an electrodeposition system containing:

(a) a tank containing an electrolyte solution;

(b) providing an essentially contamination-free acidic electrolyte in which impurities such as organics and sulfides are less than about 5 parts per million and containing ions of copper and an effective concentration of chloride ions to produce said uniform matte surface texture, said electrolyte comprising from about 50 grams per liter to about 150 grams per liter copper, from about 10 grams per liter to about 100 grams per liter sulfuric acid and from about 10 ppm to about 50 ppm chloride;

(c) a cathode having a continuous plating surface at least partially immersed in said electrolyte solution, said immersed plating surface defining the extent of the plating zone; and (d) an anode;

applying a desired current density to said cathode and said anode for plating metal values from said electrolyte solution onto said plating surface to generate a substantially uniform current distribution throughout said plating zone for promoting formation of said substantially uniform metal foil thereby electrolytically generating said foil of copper from said electrolyte;

filtering said electrolyte so that it is essentially free of sulfides, organic materials and other contaminants and particulates; and providing a flow rate of said electrolyte past said cathode sufficient to prevent oxygen accumulation along said cathode.

7. The process of claim 6 wherein said cathode comprises a rotating drum.

8. The process of claim 7 wherein said cathode comprises a stainless steel drum having a titanium or titanium alloy plating surface.

9. The process of claim 8 wherein said electrolyte comprises:

from about 70 grams per liter to about 110 grams per liter copper;

from about 30 grams per liter to about 70 grams per liter sulfuric acid; and from about 10 ppm to about 50 ppm chloride.

* * * * *